United States Patent [19]

Miyazawa et al.

[11] Patent Number: 4,896,217
[45] Date of Patent: Jan. 23, 1990

[54] SOLID-STATE IMAGING DEVICE INCLUDING A TRANSPARENT CONDUCTOR BETWEEN AN OPTICAL LOW-PASS FILTER AND AN IMAGING SENSOR

[75] Inventors: Toshio Miyazawa, Chiba; Kouzou Yasuda, Mobara; Hiroichi Soukei, Mobara; Iwao Takemoto, Mobara, all of Japan

[73] Assignee: Hitachi, Ltd., Tokyo, Japan

[21] Appl. No.: 204,737

[22] Filed: Jun. 10, 1988

[30] Foreign Application Priority Data

Jun. 10, 1987 [JP] Japan ................................. 62-144916

[51] Int. Cl.⁴ ............................................... H04N 3/14
[52] U.S. Cl. ................................ 358/213.11; 358/229; 358/909
[58] Field of Search .................... 358/213.13, 209, 909, 358/213.31, 213.11, 229

[56] References Cited

U.S. PATENT DOCUMENTS 4,518,864  5/1985  Inuiya ............................. 358/213.13
4,554,585 11/1985  Carlson ............................... 358/209
4,691,244  9/1987  Cannella et al. ............... 358/213.11

Primary Examiner—Jin F. Ng
Assistant Examiner—Stephen Brinich
Attorney, Agent, or Firm—Antonelli, Terry & Wands

[57] ABSTRACT

A solid-state imaging device is provided which includes an optical low-pass filter, and a solid-state imaging element chip for receiving optical signals through the low-pass filter. In addition, a shielding member having an optical transmissivity and an electric conductivity is interposed between the low-pass filter and the solid-state imaging element chip to improve image quality.

13 Claims, 5 Drawing Sheets

SOLID-STATE IMAGING DEVICE INCLUDING A TRANSPARENT CONDUCTOR BETWEEN AN OPTICAL LOW-PASS FILTER AND AN IMAGING SENSOR

BACKGROUND OF THE INVENTION

1. Field of the Invention

The present invention relates to a solid-state imaging device and, more particularly, to a technique which is effective when applied to a solid-state imaging device having a solid-state imaging element chip for receiving optical signals through an optical low-pass filter.

2. Description of the Prior Art

In the solid-state imaging device to be used in a video camera, the solid-state imaging element has its surface receive the optical signals, which are condensed by an optical lens, to transform the received signals into electric signals by the solid-state imaging element chip. The solid-state imaging device is equipped with the optical low-pass filter (LPF) between the optical lens and the solid-state imaging element chip so as to reduce the Moire effect which will deteriorate the image quality. The optical low-pass filter is made of a quartz plate which has an excellent controllability of the path for the optical signals and a high optical transmissivity.

Incidentally, the Moire effect of the solid-state imaging device is disclosed on pp. 134 and 135 of "SolidState Image Device" issued on July 30, 1986 by Kabushiki Kaisha Shokodo and edited by TV Association.

We have happened to discover that the fixed pattern noises dropped in their characteristic tests of a solidstate imaging device when we forgot the optical low-pass filter demounted. On the basis of this fact, we have moved the optical low-pass filter toward and apart from the solidstate imaging element chip to confirm that the fixed pattern noises change. In other words, we have confirmed that the fixed pattern noises depend highly upon the presence of the optical low-pass filter. According to our understanding, the clock signal (having a frequency of 11 MHz) of the solid-state imaging element chip impinge upon the optical low-pass filter to resonate with the intrinsic oscillations of quartz so that the resonated electromagnetic waves come incident as the reflected waves upon the solid-state imaging element chip to generate the fixed pattern noises. The clock signal is a transfer signal of the shift register of the solid-state imaging element chip. The fixed pattern noises raise a problem that the quality of the image to be projected by the solid-state imaging device is deteriorated.

SUMMARY OF THE INVENTION

An object of the present invention is to provide a technique which can reduce the fixed pattern noises to improve the image quality of a solid-state imaging device.

Another object of the present invention is to provide a technique which can achieve the above-specified object by reducing the fixed pattern noises based upon the clock signal coming from the solid-state imaging element chip.

Still another object of the present invention is to provide a technique which can achieve the above-specified objects by reducing the fixed pattern noises based upon the clock signal coming from the outside of the solid-state imaging element chip.

The aforementioned and other objects and novel features of the present invention will become apparent from the following description taken with reference to the accompanying drawings.

According to the present invention, there is provided a solid-state imaging device comprising: an optical low-pass filter; and a solid-state imaging element chip for receiving optical signals through said low-pass filter, wherein the improvement comprises a shielding member having an optical transmissivity and an electric conductivity and interposed between said low-pass filter and said solid-state imaging element chip.

The representatives of the invention to be disclosed herein will be briefly summarized in the following.

According to the present invention, the shielding member having an optical transmissivity and an electric conductivity is sandwiched between the optical low-pass filter and the solid-state imaging element chip of the solid-state imaging device.

According to the present invention, moreover, the shielding member having an optical transmissivity and an electric conductivity coats the optical low-pass filter of the solid-state imaging device.

According to the above-specified means of the present invention, the clock signal, which might otherwise impinge upon the optical low-pass filter from the solid-state imaging element chip, can be absorbed by the shielding member so that it may be electromagnetically-shielded not to reach the optical low-pass filter. As a result, it is possible to reduce the fixed pattern noises thereby to improve the quality of the image to be projected by the solid-state imaging device.

According to the above-specified means of the present invention, the clock signal, which might otherwise impinge upon the optical low-pass filter from the outside of the solid-state imaging element chip, can be absorbed by the shielding member so that it may be electromagnetically shielded not to reach the optical low-pass filter. As a result, it is possible to reduce the fixed pattern noises thereby to improve the quality of the image to be projected by the solid-state imaging device.

BRIEF DESCRIPTION OF THE ACCOMPANYING DRAWINGS

The present invention will be described in the following in connection with the structure thereof, in case the present invention is applied to the solid-state imaging device used in a video camera, with reference to the accompanying drawings, in which.

DESCRIPTION OF THE PREFERRED EMBODIMENTS

Figure 1:
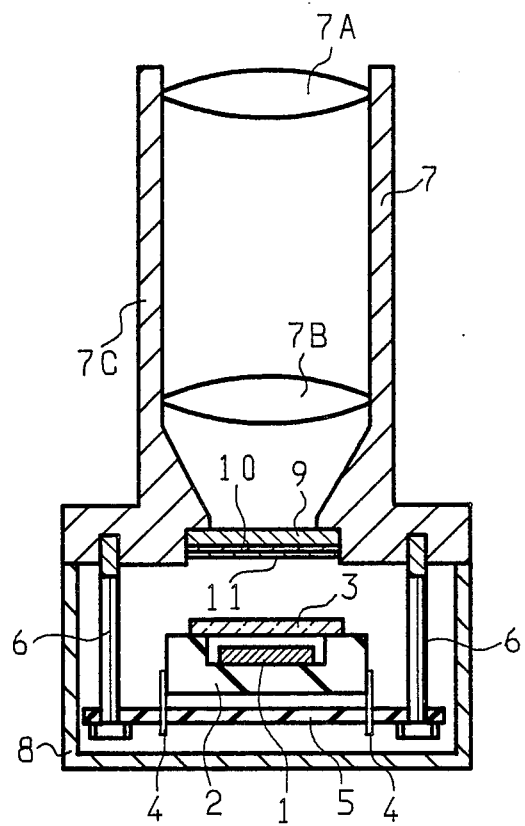
FIG. 1 is a partially sectional view showing the schematic structure of a solid-state imaging device according to an embodiment I of the present invention.

Throughout the drawings for explaining the embodiments, the parts having common functions are designated at common reference numerals, and their repeated descriptions will be omitted.

(Embodiment I)

In the solid-state imaging device, as shown in FIG. 1, there is mounted in the cavity of a packaging member 2 a solid-state imaging element chip 1 which is sealed gas-tight with a transparent glass cap 3.

The solid-state imaging element chip 1 is formed with a receiving surface on which are arranged in a matrix form a plurality of photo-diodes for converting optical signals into electric signals, although not shown. The solid-state imaging element chip 1 is arranged on the periphery of its receiving surface with shift registers for sequentially transforming the electric signals of the individual photodiodes. Each of the shift registers is made of MOSIC and made responsive to the clock signal (or transfer signal) coming from the outside of the solid-state imaging element chip 1

This solid-state imaging element chip 1 is connected through bonding wires with the wiring lines formed in the cavity of the packaging member 2. These wiring lines are connected through the inside of the packaging member 2 with leads 4.

The packaging member 2 is made of a ceramic material, for example.

The transparent glass cap 3 is made of a transparent glass substrate.

The solid-state imaging element chip 1 thus sealed up gas-tight by the packaging member 2 and the transparent glass cap 3 is mounted through the leads 4 in a printed circuit substrate 5. This printed circuit substrate 5 is mounted on a lens mounting member 7 by means of bolts 6 and is sealed up with a shield cover 8.

This shield cover 8 is made of a metallic material such as an aluminum alloy or a hard resin.

The lens mounting member 7 is constructed by mounting optical lenses (of glass, for example) 7A and 7B on a lens frame 7C. This lens frame 7C is made of a metallic material such as an aluminum alloy or a hard resin.

In the lens frame 7C of the lens mounting member 7 between the optical lens 7B and the solid-state imaging element chip 1, there is mounted an optical low-pass filter 9 and an infrared filter 10. The filter 10 serves to prevent the passage of infrared rays to the imaging chip 1.

The optical low-pass filter (LPF) 9 is provided for reducing the Moire effect. The optical low-pass filter 9 is made of such a quartz plate as can highly control the path of the optical signals having passed through the optical lenses 7A and 7B. The optical low-pass filter 9 thus constructed is called the "optical quartz filter". This optical low-pass filter can be made of an artificial diamond plate, although expensive.

The solid-state imaging device thus constructed is further equipped with a shielding member 11 on the surface of the infrared filter 10 between the solid-state imaging element chip 1 and the optical low-pass filter 9. This shielding member 11 is made of such a transparent, conductive material as has an optical transmissivity for transmitting the optical signals and an electric conductivity. More specifically, the shielding member 11 is made of a transparent, conductive material ITO of a mixture of $In_2O_3$ and $ZnO_2$. This transparent, conductive material ITO is formed by the sputtering method.

By thus equipping the solid-state imaging device with the shielding member 11, the clock signal (or the transfer signal of the shift registers) impinging upon the optical low-pass filter 9 from the solid-state imaging element chip 1 can be absorbed by the shielding member 11 so that they may be electromagnetically shielded not to reach the optical low-pass filter 9. As a result, it is possible to eliminate the electro-magnetic waves which might otherwise be resonated with and reflected by the optical low-pass filter 9, thus reducing the fixed pattern noises of the solid-state imaging element chip 1. Thus, the quality of the image to be projected on the solid-state imaging device can be improved.

(Embodiment II)

The present embodiment II is a second embodiment of the present invention, in which the mounting position of the shielding member on the solid-state imaging device is changed.

Figure 2:
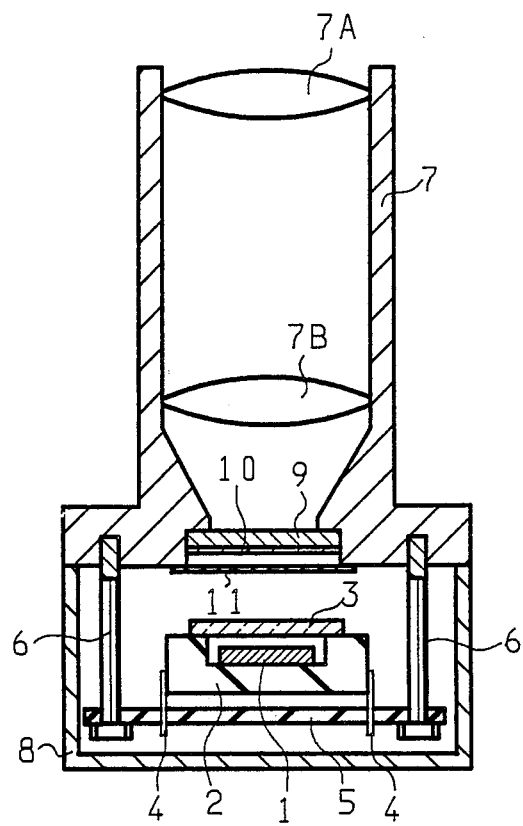
FIG. 2 is a partially sectional view showing the schematic structure of a solid-state imaging device according to an embodiment II of the present invention.

The schematic structure of the solid-state imaging device according to the embodiment II of the present invention is shown in FIG. 2 (in partial section).

In the solid-state imaging device, as shown in FIG. 2, the shielding member 11 is mounted on the lens frame 7C of the lens mounting member 7 between the solid-state imaging element chip 1 and the optical low-pass filter 9.

The solid-state imaging device thus constructed can enjoy effects similar to those of the foregoing embodiment I.

(Embodiment III)

The present embodiment III is a third embodiment of the present invention, in which the mounting position of the shielding member on the solid-state imaging device is changed.

Figure 3:
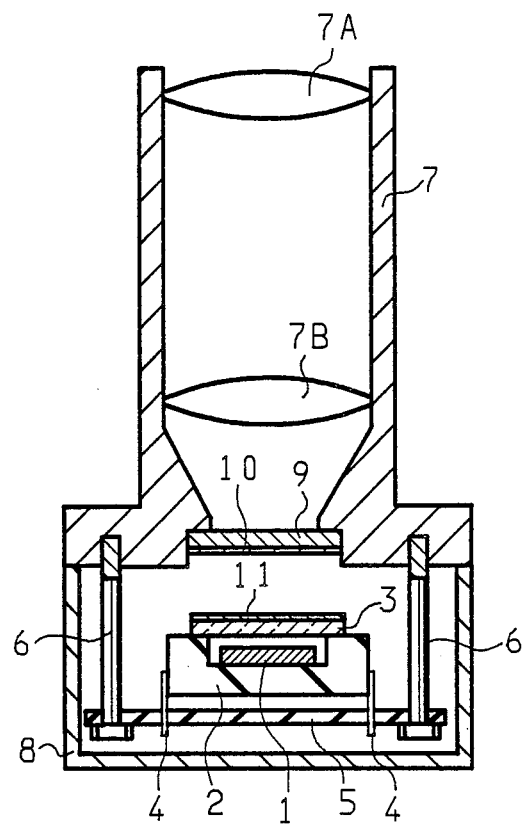
FIG. 3 is a partially sectional view showing the schematic structure of a solid-state imaging device according to an embodiment III of the present invention.

The schematic structure of the solid-state imaging device according to the embodiment III of the present invention is shown in FIG. 3 (in partial section).

In this solid-state imaging device, as shown in FIG. 3, the shielding member is mounted on the surface of the transparent glass cap 3 for sealing the solid-state imaging element chip 1 gas-tight between the solid-state imaging element chip 1 and the optical low-pass filter 9.

The solid-state imaging device thus constructed can enjoy effects similar to those of the foregoing embodiment I.

(Embodiment IV)

The present embodiment IV is a fourth embodiment of the present invention, in which the mounting position of the shielding member on the solid-state imaging device is changed.

Figure 4:
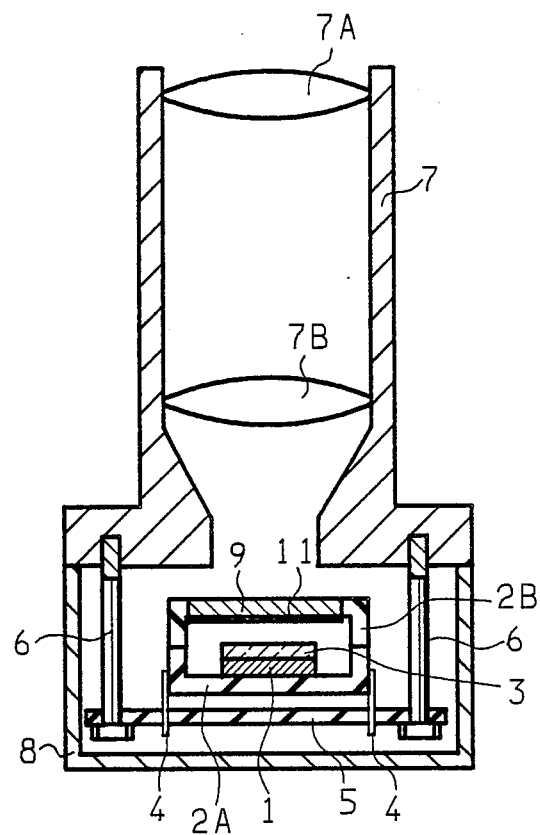
FIG. 4 is a partially sectional view showing the schematic structure of a solid-state imaging device according to an embodiment IV of the present invention.

The schematic structure of the solid-state imaging device according to the embodiment IV of the present invention is shown in FIG. 4 (in partial section).

In this solid-state imaging device, as shown in FIG. 4, the solid-state imaging element chip 1 is sealed gas-tight in the cavity which is defined by a base packaging member 2A and a cap packaging member 2B. The optical low-pass filter 9 is attached to the incident portion of the optical signals upon the cap packaging member 2B.

In the solid-state imaging device thus constructed, the shielding member 11 is mounted on the surface (or inside of the cavity) of the optical low-pass filter 9 attached to the cap packaging member 2B between the solid-state imaging element chip 1 and the optical low-pass filter 9.

The solid-state imaging device thus constructed can enjoy effects similar to those of the foregoing embodiment I.

(Embodiment V)

The present embodiment V is a fifth embodiment of the present invention, in which the fixed pattern noises are reduced relative to the clock signal coming from the outside of the solid-state imaging element chip of the solid-state imaging device.

Figure 5:
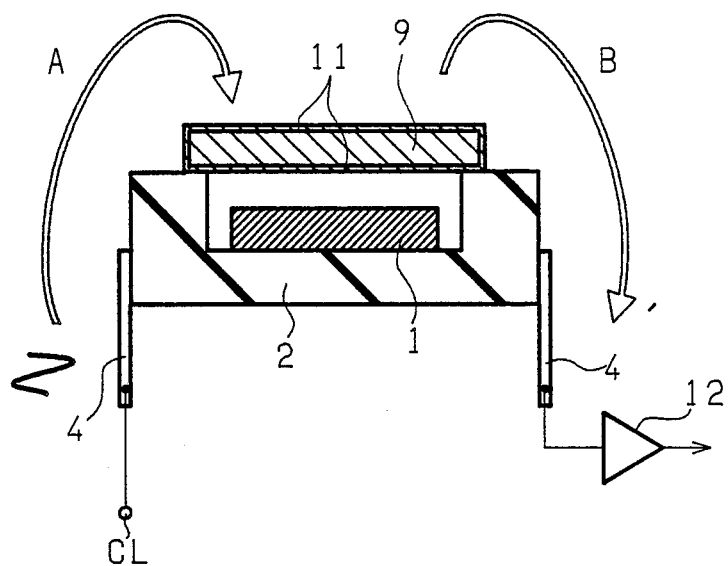
FIG. 5 is a partially sectional view showing the schematic structure of a solid-state imaging device according to an embodiment V of the present invention.

The schematic structure of the essential portion of the solid-state imaging device according to the embodiment V of the present invention is shown in FIG. 5 (in partial section).

In the solid-state imaging device, as shown in FIG. 5, the clock signal to be inputted to the solid-state imaging element chip 1 is inputted through the lead 4 from a signal terminal CL outside of the packaging member 2. The video signal of the solid-state imaging element chip 1 is outputted through the lead 4 to a preamplifier 12 outside of the packaging member 2.

The solid-state imaging element chip 1 is mounted on the packaging member 2 and is sealed up gas-tight by the optical low-pass filter 9 acting as a sealing cap.

In the solid-state imaging device thus constructed, the optical low-pass filter 9 acting as the aforementioned sealing cap is coated with the shielding member 11.

Thus, the optical low-pass filter 9 of the solid-state imaging device is constructed into the gas-tight sealing cap and is coated with the shielding member 11 so that the effects obtainable are similar to those of the foregoing embodiment I. The clock signal (passing along arrow A) impinging upon the optical low-pass filter 9 from the signal terminal CL outside of the solid-state imaging element chip 1 can be absorbed by the shielding member 11 so that it may be electromagnetically shielded not to reach the optical low-pass filter 9. Thus, it is possible to eliminate the electromagnetic waves (passing long arrow B) resonated with the optical low-pass filter 9 and reflected to the preamplifier 12 and to reduce the fixed pattern noises to be superposed outside of the solid-state imaging element chip 1. As a result, it is possible to improve the quality of the image to be projected in the solid-state imaging device.

Our invention has been specifically described in connection with the foregoing embodiments, but it should not be limited thereto but can naturally be modified in various manners without departing from the gist thereof.

For example, the present invention can be modified such that the shielding layer having an optical transmissivity and an electric conductivity is formed on the surface of the solid-state imaging element chip 1 of the solid-state imaging device.

The effects obtainable from the representatives of the invention to be disclosed hereinbefore will be briefly described in the following.

Since, in the solid-state imaging device, the fixed pattern noises to be generated by the clock signal coming from the solid-state imaging element chip can be reduced, the quality of the image to be projected can be improved.

Since, moreover, the fixed pattern noises to be generated by the clock signal coming from the outside of the solid-state imaging element chip can be reduced, the quality of the image to be projected can be improved.

What is claimed is:

1. A solid-state imaging device comprising: an optical low-pass filter; and a solid-state imaging element chip for receiving optical signals through said low-pass filter, wherein the improvement comprises a shielding member having an optical transmissivity and an electric conductivity and interposed between said low-pass filter and said solid-state imaging element chip.

2. A solid-state imaging device according to claim 1, wherein said shielding member is sandwiched between said low-pass filter and said solid-state imaging element chip.

3. A solid-state imaging device according to claim 1, wherein said shielding member coats said low-pass filter.

4. A solid-state imaging device according to claim 1, wherein said shielding member is made of a transparent conductive material composed of a mixture of $In_2O_3$ and $ZnO$.

5. A solid-state imaging device according to claim 1, wherein said low-pass filter is an optical quartz filter.

6. A solid-state imaging device comprising:
a solid-state imaging chip;
means for providing optical signals to said solid-state imaging chip along a predetermined optical signal path;
an optical low-pass filter provided on said optical signal path for reducing a Moire effect in said solid-state imaging device; and
means provided on said optical signal path for preventing the generation of electromagnetic waves between said solid-state imaging chip and said optical low-pass filter by preventing electrical signals generated in said solid-state imaging chip from impinging on said optical low-pass filter, wherein said means comprises a shielding member formed on said optical path between said solid-state imaging chip and said optical low-pass filter.

7. A solid-state imaging device according to claim 6, wherein said shielding member comprises a shielding layer formed on said optical low-pass filter.

8. A solid-state imaging device according to claim 6, further comprising an infrared filter formed on said optical path.

9. A solid-state imaging device according to claim 8, wherein said optical low-pass filter, said infrared filter and said shielding member are formed as a layered structure on said optical path.

10. A solid-state imaging device according to claim 9, wherein said optical path further includes a lens system for providing optical signals to said chip, wherein said optical low-pass filter, said infrared filter and said shielding member are formed between said lens system and said imaging chip.

11. A solid-state imaging device according to claim 6, wherein said shielding member prevents timing signals in said imaging chip from impinging on said low-pass filter.

12. A solid-state imaging device according to claim 6, wherein said shielding member is made of a transparent conductive material composed of a mixture of $In_2O_3$ and $ZnO_2$.

13. A solid-state imaging device according to claim 6, wherein said low-ass filter is an optical quartz filter.

* * * * *